US010875143B2

(12) United States Patent
Hwang et al.

(10) Patent No.: US 10,875,143 B2
(45) Date of Patent: Dec. 29, 2020

(54) APPARATUS AND METHODS FOR CHEMICAL MECHANICAL POLISHING

(71) Applicant: TAIWAN SEMICONDUCTOR MANUFACTURING COMPANY LTD., Hsinchu (TW)

(72) Inventors: James Jeng-Jyi Hwang, Hsin-Chu County (TW); Jiann Lih Wu, Hsin-Chu (TW); He Hui Peng, Changhua County (TW); Chi-Ming Yang, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 16/521,366

(22) Filed: Jul. 24, 2019

(65) Prior Publication Data

US 2020/0039019 A1 Feb. 6, 2020

Related U.S. Application Data

(60) Provisional application No. 62/712,513, filed on Jul. 31, 2018.

(51) Int. Cl.
*B24B 37/013* (2012.01)
*H01L 21/00* (2006.01)
*H01L 21/66* (2006.01)
*H01L 21/321* (2006.01)
*H01L 21/3105* (2006.01)

(52) U.S. Cl.
CPC ...... *B24B 37/013* (2013.01); *H01L 21/31053* (2013.01); *H01L 21/3212* (2013.01); *H01L 22/26* (2013.01)

(58) Field of Classification Search
CPC .......... H01L 21/3212; H01L 21/31053; H01L 21/67253; H01L 21/67092; H01L 21/02; H01L 21/67288; H01L 22/26; H01L 22/22; H01L 22/12; H01L 22/34; B24B 37/107; B24B 37/013; B24B 37/005; B24B 37/205; B24B 37/042; B24B 37/0053; B24B 37/34; B24B 53/017
See application file for complete search history.

(56) References Cited

U.S. PATENT DOCUMENTS 9,403,254 B2 * 8/2016 Hwang ................. B24B 37/005
2013/0044004 A1 * 2/2013 Hwang ................. B24B 37/042
340/679

* cited by examiner

*Primary Examiner* — Nikolay K Yushin
(74) *Attorney, Agent, or Firm* — WPAT, P.C., Intellectual Property Attorneys; Anthony King

(57) ABSTRACT

An apparatus for CMP includes a platen, a wafer carrier retaining a semiconductor wafer during a polishing operation, a dresser configured to recondition a polishing pad disposed on the platen during the polishing operation, and a vibration-monitoring system configured to detect vibrations during the polishing operation. The vibration-monitoring system includes a first vibration sensor configured to generate a plurality of first vibration signals. An end point is triggered to the polishing when a change between the plurality of vibration signals reaches a value.

20 Claims, 12 Drawing Sheets

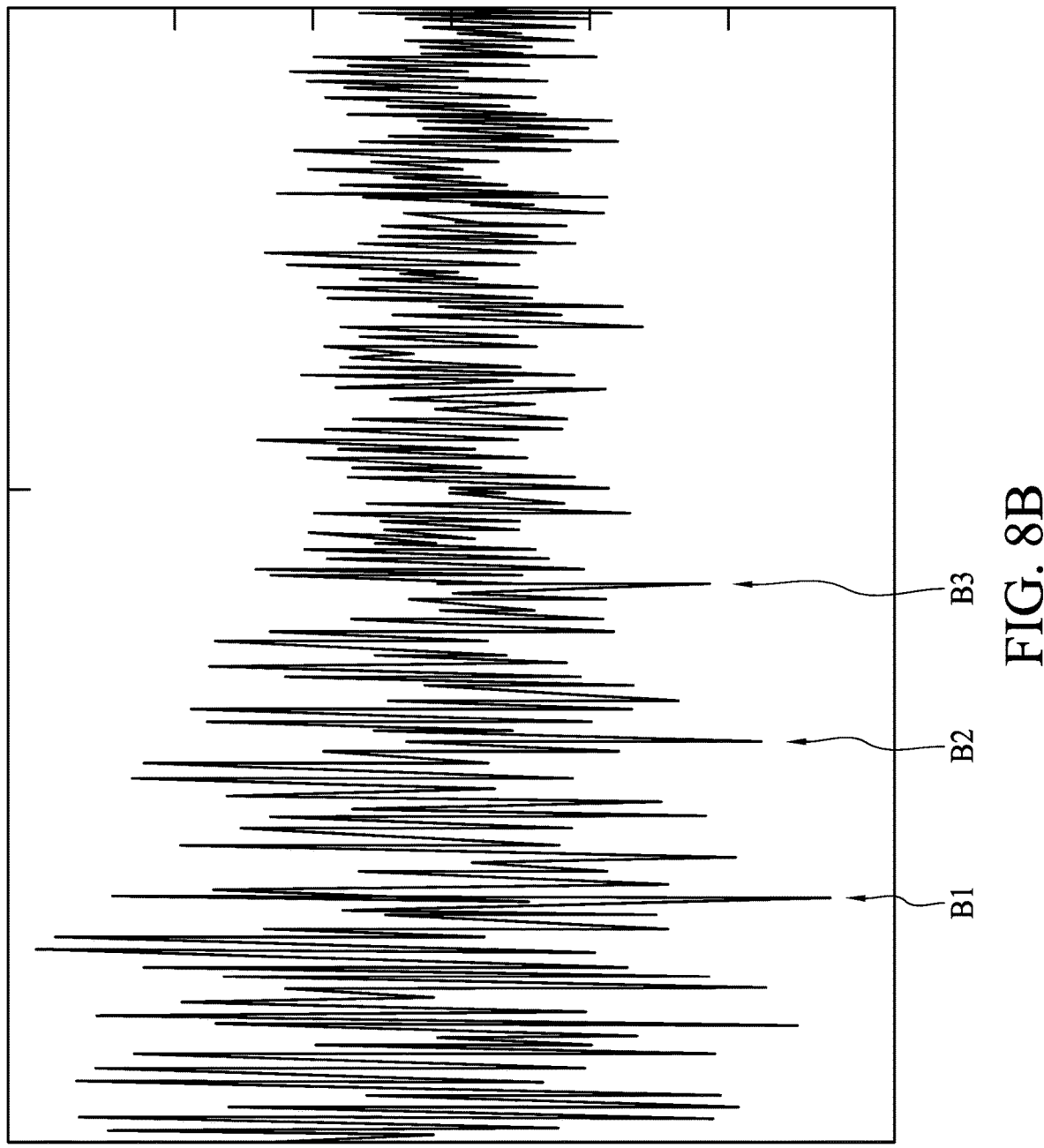

APPARATUS AND METHODS FOR CHEMICAL MECHANICAL POLISHING

PRIORITY DATA

This patent claims the benefit of U.S. Provisional Patent Application Ser. No. 62/712,513 filed Jul. 31, 2018, the entire disclosure of which is hereby incorporated by reference.

BACKGROUND

Chemical mechanical polishing (CMP) is widely used in the fabrication of integrated circuits. As an integrated circuit is built layer by layer on a surface of a semiconductor wafer, CMP is used to planarize the topmost layer or layers to provide a level surface for subsequent fabrication operations. CMP is carried out by placing the semiconductor wafer in a wafer carrier that presses the wafer surface to be polished against a polishing pad attached to a platen. The platen and the wafer carrier are counter-rotated while an abrasive slurry containing both abrasive particles and reactive chemicals is applied to the polishing pad. The slurry is transported to the wafer surface via the rotation of the polishing pad. The relative movement of the polishing pad and the wafer surface coupled with the reactive chemicals in the abrasive slurry allows CMP to level the wafer surface by means of both physical and chemical actions.

CMP can be used at a number of time points during the fabrication of an integrated circuit. For example, CMP may be used to planarize the inter-level dielectric layers that separate the various circuit layers in an integrated circuit. CMP is also commonly used in the formation of the conductive lines of interconnect components in an integrated circuit. By abrasively polishing the surface of the semiconductor wafer, excess material and surface roughness in layers can be removed.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIG. 8B is a graph showing a vibration pattern obtained during a polishing operation according to aspects of the present disclosure.

DETAILED DESCRIPTION

Figure 1:
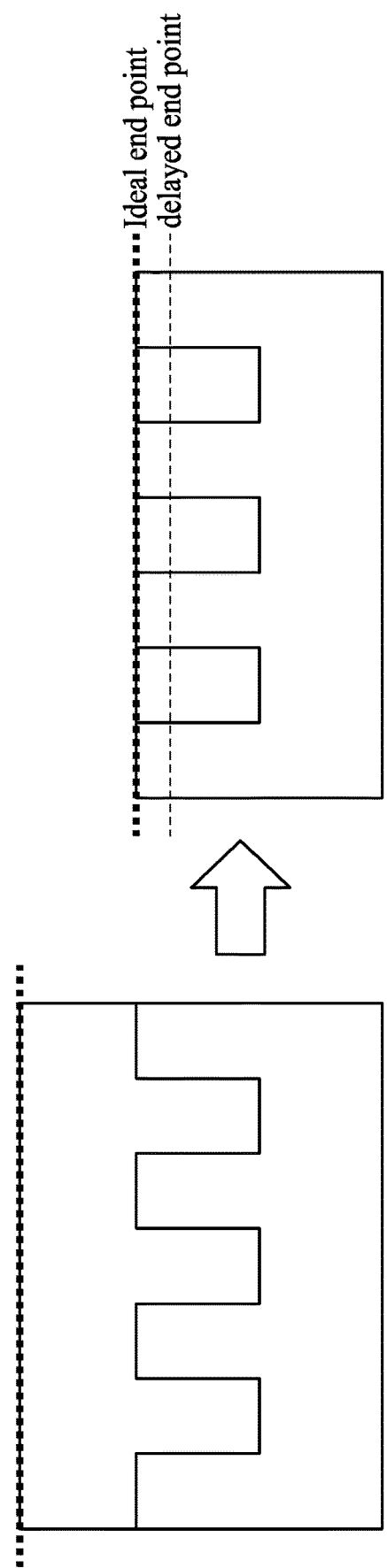
FIG. 1 is a schematic drawing illustrating an over polishing issue according to some comparative embodiments.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper," "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 100 degrees or at other orientations) and the spatially relative descriptors used herein may likewise be interpreted accordingly.

As used herein, the terms such as "first," "second" and "third" describe various elements, components, regions, layers and/or sections, but these elements, components, regions, layers and/or sections should not be limited by these terms. These terms may be only used to distinguish one element, component, region, layer or section from another. The terms such as "first," "second" and "third" when used herein do not imply a sequence or order unless clearly indicated by the context.

CMP is an appropriate and widely-used process to remove excess material and to achieve planarization of a substrate. However, CMP suffers from difficulty of its process control. In particular, end point detection, or exact determination of a moment at which the polishing process should be stopped, has been a problem for the industry. In some comparative embodiments, the CMP process is frequently carried out without a clear signal about when the process is completed, and instead estimates the completion point merely by using empirical polishing rates. In other comparative embodiments, a motor torque sensor is used to detect a rotational torque and motor current change to reveal polishing information. Usually, a polishing force and polishing torque are kept the same until a surface of another material layer is exposed. The polishing force and polishing torque are then changed due to the different frictions between the original material layer and the newly exposed material layer, and a motor compensation current is generated and fed back to change the motor current. Thus, the motor current change is detected and an end point is triggered.

Figure 2:
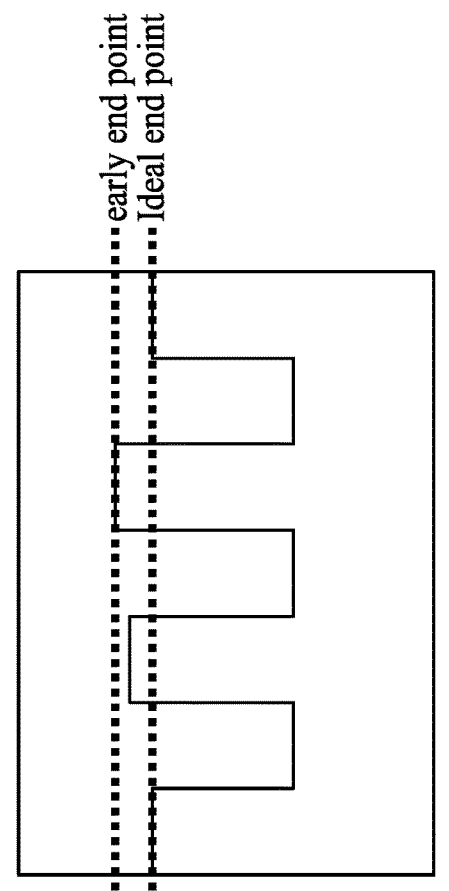
FIG. 2 is a schematic drawing illustrating an under-polishing issue according to some comparative embodiments.
Figure 2:
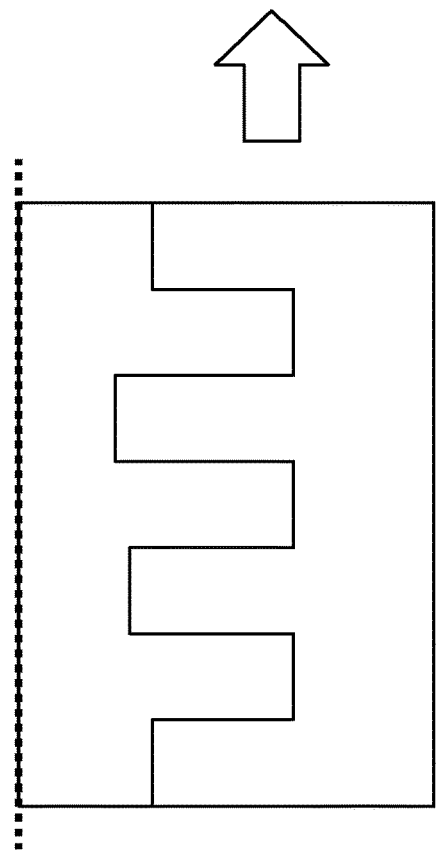

Please refer to FIGS. 1 and 2, which are schematic drawings illustrating different polishing issues according to some comparative embodiments. It is found that although the motor torque change reveals a practical polishing condition, the condition revealed is based on an indirect signal obtained by calculating the motor torque change and the current change. Therefore, an end point may be delayed and thus a time delay may exist between the delayed end point and an ideal end point of the polishing. Accordingly, an over-polishing issue may be caused, as shown in FIG. 1. Further, when polishing a wafer having poor uniformity, the torque current change may not be clear enough to accurately trigger or indicate the end point, and thus may result in an early end point. Therefore an under-polishing issue may be caused, as shown in FIG. 2. Further, early end point triggering, which causes the under-polishing issue, or delayed end point triggering, which causes the over-polishing issue, may cause a need for rework or raise a process alarm.

Additionally, the motor torque sensor is adopted only for end point detection and end point control, while abundant information about a CMP process remains unrevealed. For example, information about a scratch on a wafer, polishing pad roughness, dressing control, equipment failure pre-warning, etc. are not revealed.

The present disclosure therefore provides a CMP apparatus having vibration sensors installed to detect vibration in a polishing operation and to generate vibration signals related to the polishing operation. By detecting changes in vibrations, an end point can be accurately triggered. Further, since the CMP process adopts mechanical abrasion, the vibration signals induced by the mechanical abrasion are able to reveal extensive tool and process information. In some embodiments, by introducing and utilizing the vibration sensors, the vibration signals are detected, gathered and analyzed to build a database and to construct standard or target process patterns about wafer surface, pad roughness or equipment condition. Further, by comparing real-time process patterns with standard process patterns, wafer scratch monitoring, pad surface roughness control and equipment failure pre-warning can be achieved. In other words, the polishing operation can be easily monitored and controlled.

Figure 3:
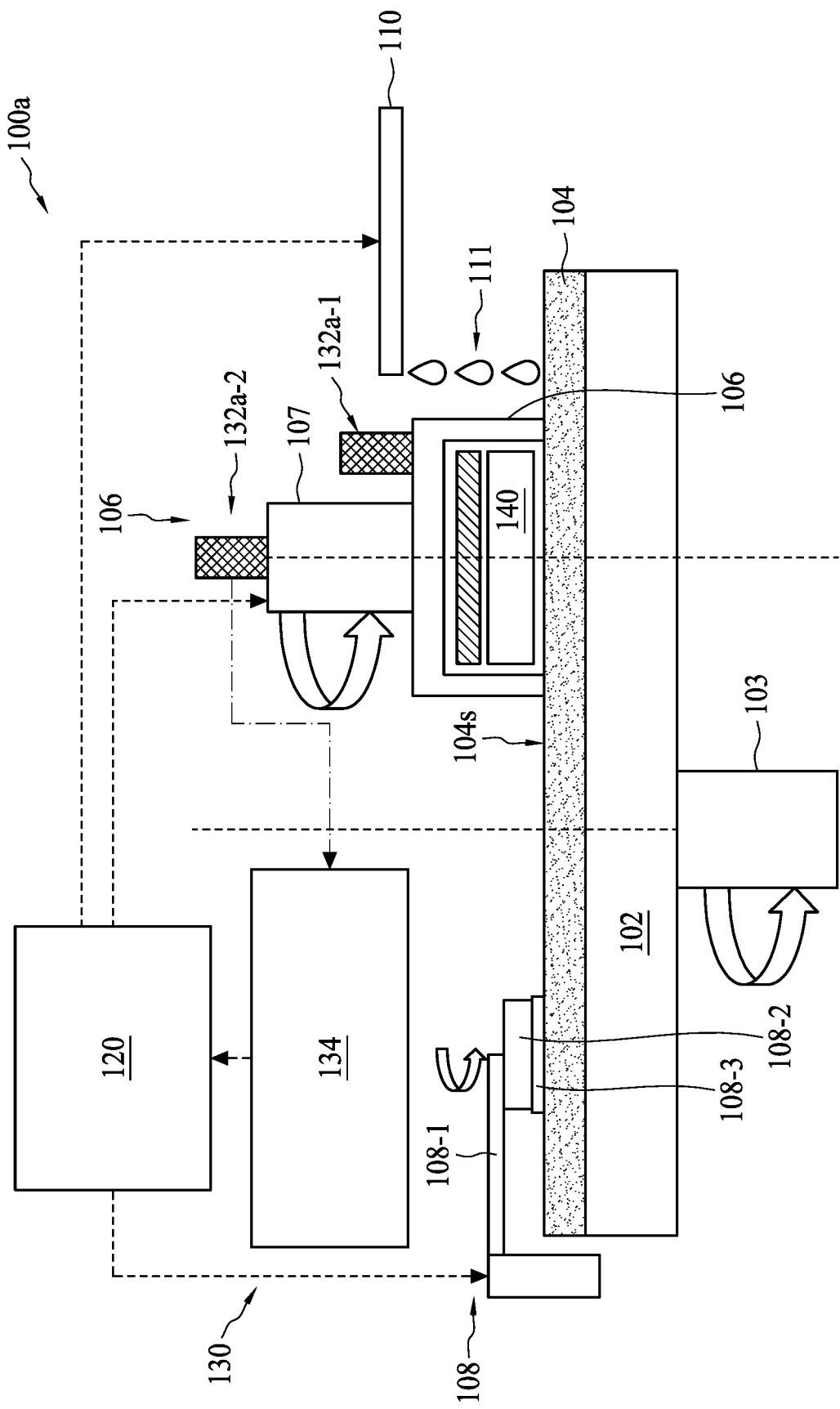
FIG. 3 is a schematic drawing illustrating an apparatus for CMP according to aspects of one or more embodiments of the present disclosure.
Figure 4:
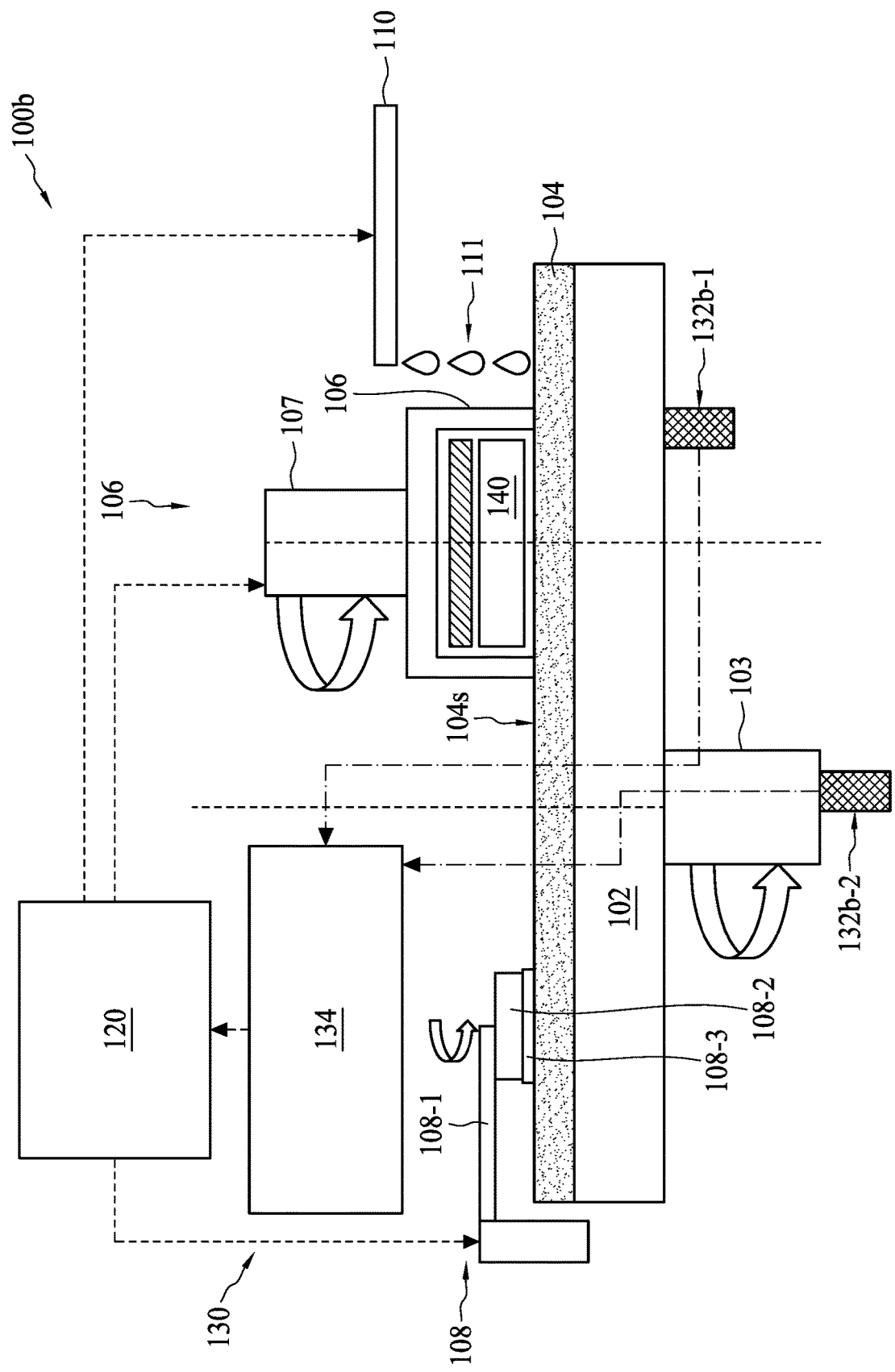
FIG. 4 is a schematic drawing illustrating an apparatus for CMP according to aspects of one or more embodiments of the present disclosure.
Figure 5:
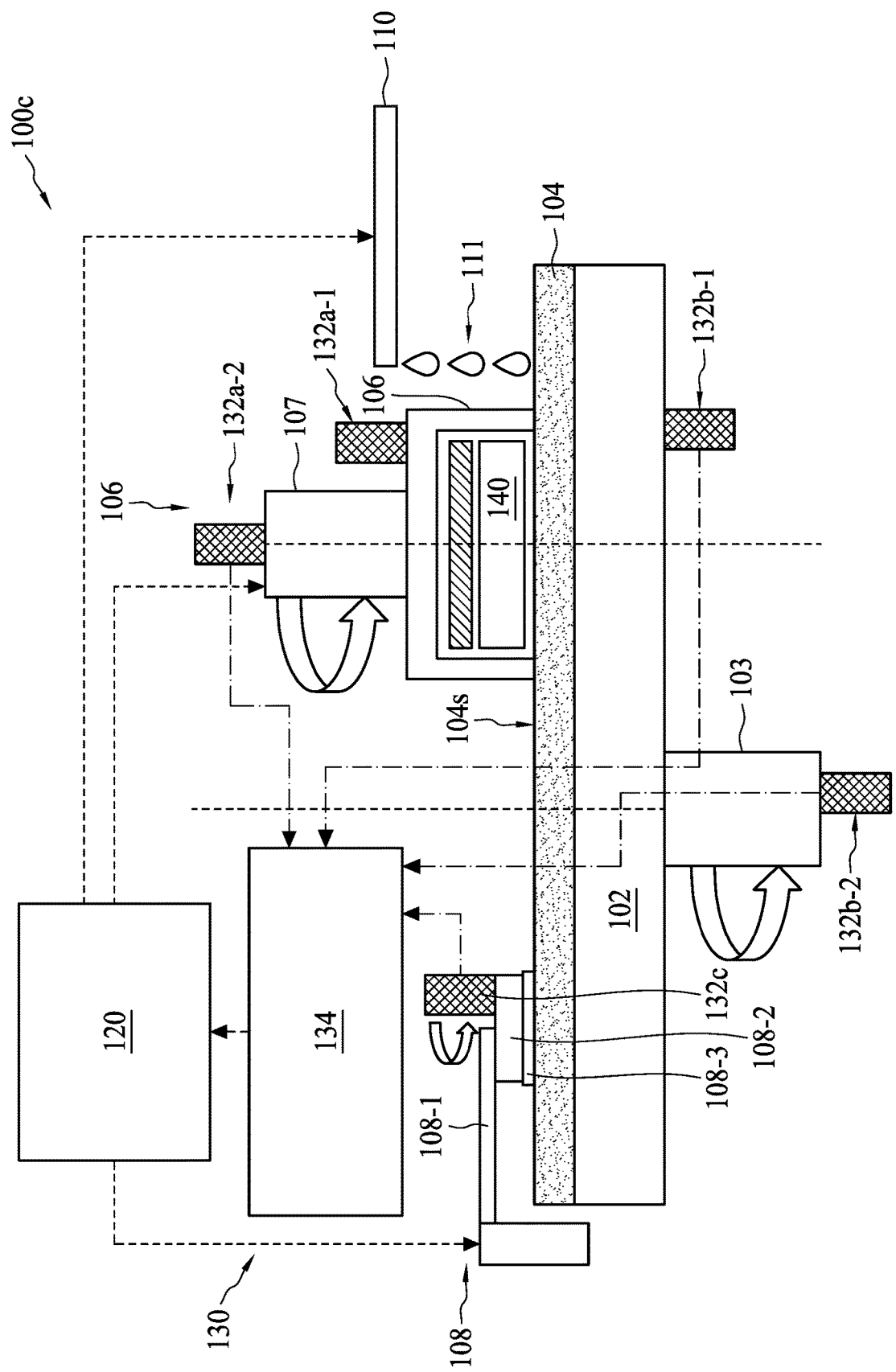
FIG. 5 is a schematic drawing illustrating an apparatus for CMP according to aspects of one or more embodiments of the present disclosure.

FIGS. 3-5 are schematic drawings illustrating an apparatus for CMP 100a, 100b and 100c according to aspects of one or more embodiments of the present disclosure. It should be understood that same elements in FIGS. 3-5 are depicted by same numerals, and repetitive details may be omitted in the interest of brevity. The apparatus for CMP 100a, 100b and 100c respectively includes a platen 102, a polishing pad 104 provided on top of the platen 102, a wafer carrier (sometimes referred to as a polishing head) 106 configured to support a semiconductor wafer 140, a dresser 108 configured to recondition the polishing pad 104, and a slurry dispenser 110 configured to dispense or deliver an abrasive slurry 111 to the polishing pad 104 to facilitate removal of materials from the semiconductor wafer 140. The apparatus for CMP 100a, 100b and 100c further include a CMP control system 120 configured to control the platen 102, the wafer carrier 106, the dresser 108 and the slurry dispenser 110. The apparatus for CMP 100a, 100b and 100c further include a vibration-monitoring system 130 configured to detect vibrations, as shown in FIGS. 3-5.

In some embodiments, the platen 102 is configured to rotate in one or more directions. In some embodiments, the platen 102 is configured to be held stationary. In some embodiments, the platen 102 is configured to have a constant rotational speed. In alternative embodiments, the platen 102 is configured to have a variable rotational speed. The platen 102 can be rotated by a motor (not shown). In some embodiments, the motor can be an alternating current (AC) motor, a direct current (DC) motor, a universal motor, or another suitable motor. The platen 102 is configured to support the polishing pad 104, as shown in FIGS. 3-5. In some embodiment, the platen 102 can be rotated by a rotating shaft 103, which have a variable rotational speed. The rotating shaft 103 can be rotated by a motor (not shown). In some embodiments, the motor can be an AC motor, a DC motor, a universal motor, or another suitable motor.

The polishing pad 104 is coupled to the platen 102 such that the polishing pad 104 is rotated in a same direction at a same speed as the platen 102. The polishing pad 104 includes a polishing surface 104s, such as a textured surface, which is configured to remove materials from the semiconductor wafer during a polishing operation.

The wafer carrier 106 is configured to support and retain the semiconductor wafer 140 proximate to the polishing surface 104s of the polishing pad 104 during the polishing operation. In some embodiments, the wafer carrier 106 includes a retaining ring to secure the semiconductor wafer 140. In some embodiments, the wafer carrier 106 includes a vacuum to secure the semiconductor wafer 140. The wafer carrier 106 is configured to rotate in a direction that is the same as or different from a direction of rotation of the platen 102. In some embodiments, a spin shaft 107 rotates the wafer carrier 106 in a direction opposite to the direction of the rotation of the platen 102. In some embodiments, the spin shaft 107 is configured to have a constant rotational speed. In alternative embodiments, the spin shaft 107 is configured to have a variable rotational speed. The spin shaft 107 can be rotated by a motor (not shown). In some embodiments, the motor can be an AC motor, a DC motor, a universal motor, or another suitable motor.

The wafer carrier 106 can be moved in a direction perpendicular to the polishing surface 104s of the polishing pad 104. By moving the semiconductor wafer carrier 106 in the direction perpendicular to the polishing surface 104s, a pressure exerted on the semiconductor wafer 140 by the polishing pad 104 is adjustable. In some embodiments, the apparatus for CMP 100a, 100b and 100c can include pressure sensors (not shown) to monitor the pressure exerted on the semiconductor wafer 140. In some embodiments, the apparatus for CMP 100a, 100b and 100c can include a pressure control system (not shown) to control force exerted on the semiconductor wafer 140 at various locations of the semiconductor wafer 140. In some embodiments, the pressure control system can include nozzles configured to emit pressurized gas, translatable pins or other suitable force-exerting elements.

The dresser 108 is configured to recondition the polishing pad 104. In order to maintain the polishing rate, the polishing pad 104 needs to be conditioned to maintain the surface roughness. In some embodiments, a dressing operation (or a conditioning operation) is performed on the polishing pad 104. As shown in FIGS. 3-5, the dresser 108 can include a dresser arm 108-1, a dresser head 108-2, and a conditioning disc 108-3, in accordance with some embodiments. In some embodiments, the conditioning disc 108-3 may be a diamond disc with diamonds embedded in a metallic layer secured to a support plate of the conditioning disc 108-3. The metallic layer is, for example, a Ni layer and/or a Cr layer. The conditioning disc 108-3 is used to scratch and refresh the polishing surface 104s of the polishing pad 104, when the polishing pad 104 has accumulated an excess of polishing debris. Due to the dressing operation performed by the dresser 108, the polishing surface 104s of the polishing pad 104 can be refreshed and the CMP rate can be maintained.

The slurry dispenser 110 is configured to dispense the abrasive slurry 111 onto the polishing surface 104s of the polishing pad 104. The slurry dispenser 110 includes at least one nozzle (not shown) configured to dispense the abrasive slurry 111. In some embodiments, the apparatus for CMP 100a, 100b and 100c can include a slurry mix system (not shown) configured to mix various fluid compositions prior to dispensing the mixture onto the polishing surface 104s of the polishing pad 104.

The CMP control system 120 is configured to control the wafer carrier 106, the dresser 108 and the slurry dispenser 110. In some embodiments, the semiconductor wafer 140 is held inside the wafer carrier 106 with upward suction applied to the wafer's backside. The platen 102 is rotated, and the polishing pad 104 is correspondingly rotated. The abrasive slurry 111 is then dispensed onto the polishing surface 104s. The wafer carrier 106 is then rotated and lowered toward the polishing pad 104. When the rotation of the wafer carrier 106 reaches a wafer-polishing speed, the semiconductor wafer 140 is pressed to contact the polishing surface 104s. This dual rotation, along with the downward force applied to the semiconductor wafer 140 and the abrasive slurry 111, causes the semiconductor wafer 140 to be gradually planarized.

In some embodiments, the vibration-monitoring system 130 of the apparatus for CMP 100a includes a vibration sensor 132a-1 and/or a vibration sensor 132a-2. The vibration-monitoring system 130 further includes a signal analyzer 134. In some embodiments, the vibration sensor 132a-1 is installed on the wafer carrier 106 and configured to detect vibrations of the wafer carrier 106 and vibrations of the semiconductor wafer 140 retained within the wafer carrier 106. In other embodiments, the vibration sensor 132a-2 is installed on the spin shaft 107 and configured to detect vibrations of the wafer carrier 106 and vibrations of the semiconductor wafer 140 retained within the wafer carrier 106. Further, a plurality of vibration signals related to the wafer carrier 106 and the semiconductor wafer 140 is generated by the vibration sensor 132a-1 or 132a-2. The plurality of vibration signals is then sent to the signal analyzer 134, as shown in FIG. 3.

In some embodiments, the plurality of vibration signals of the wafer carrier 106 and the semiconductor wafer 140 is sent to and stored in the signal analyzer 134 to develop a process pattern. In some embodiments, the signal analyzer 134 further builds a process pattern database according to the vibration signals of the wafer carrier 106 and the semiconductor wafer 140. In some embodiments, a standard process pattern can generated from the process pattern database. The process pattern, the stand process pattern and the process pattern database will be described in the following description.

Referring to FIG. 4, in some embodiments, the vibration-monitoring system 130 of the apparatus for CMP 100b includes a vibration sensor 132b-1 or a vibration sensor 132b-2. The vibration-monitoring system 130 further includes a signal analyzer 134. In some embodiments, the vibration sensor 132b-1 is installed on or affixed to the platen 102 and configured to detect vibrations of the platen 102 and the polishing pad 104 disposed on the platen 102. In other embodiments, the vibration sensor 132b-2 is installed on the rotating shaft 103 and configured to detect vibrations of the platen 102 and the polishing pad 104 disposed on the platen 102. A plurality of vibration signals related to the platen 102 and is generated by the vibration sensor 132b-1 or 132b-2. The plurality of vibration signals is then sent to the signal analyzer 134, and the signal analyzer 134 is configured to construct a process pattern according to the plurality of vibration signals from the vibration sensors 132b-1/132b-2, as shown in FIG. 4.

Referring to FIG. 5, in some embodiments, the vibration-monitoring system 130 of the apparatus for CMP 100c includes a vibration sensor 132a-1 or 132a-2, a vibration sensor 132b-1 or 132b-2 and a vibration sensor 132c. The vibration-monitoring system 130 further includes a signal analyzer 134. The vibration sensor 132a-1 is installed on the wafer carrier 106 and the vibration sensor 132a-2 is installed on the spin shaft 107. The vibration sensor 132a-1 or 132a-2 is configured to detect vibrations of the wafer carrier 106 and the semiconductor wafer 140. A plurality of vibration signals related to the wafer carrier 106 and the semiconductor wafer 140 retained therein is generated by the vibration sensor 132a-1 or 132a-2. The vibration sensor 132b-1 is installed on the platen 102 and the vibration sensor 132b-2 is installed on the rotating shaft 103. A plurality of vibration signals related to the platen 102 and the polishing pad 104 is generated by the vibration sensor 132b-1 or 132b-2. The vibration sensor 132c is installed on the dresser 108. In some embodiments, the vibration sensor 132c is installed on the dresser head 108-2 and configured to detect vibrations of the dresser 108 (i.e., the dresser head 108-2 and the disc 108-3) and to generate a plurality of vibration signals related to the dresser 108. The plurality of vibration signals is then sent to the signal analyzer 134, as shown in FIG. 5. In some embodiments, the signal analyzer 134 is configured to construct a process pattern according to the plurality of vibration signals from the vibration sensors 132a-1/132a-2, 132b-1/132b-2 and 132c.

It should be noted that since the apparatus for CMP 100a, 100b and 100c use mechanical abrasion to achieve planarization, vibrations occur at the wafer carrier 106, the dresser 108 and the platen 102. Therefore, the vibration signals of the wafer carrier 106 may be interfered with the vibration signals of the dresser 108 and the vibration signals of the platen 102, the vibration signals of the dresser 108 may be interfered with the vibration signals of the wafer carrier 106 and the vibration signals of the platen 102, and the vibration signals of the platen 102 may be interfered with the vibration signals of the wafer carrier 106 and the vibration signals of the dresser 108. In other words, if only the vibration signals of the wafer carrier 106 are detected, it may not be possible to exclude noise from the dresser 108 and the platen 102. Therefore in some embodiments, the vibration signals of the wafer carrier 106, the dresser 108 and the platen 102 are all detected and sent to the signal analyzer 134. In some embodiments, by using, for example but not limited thereto, a big data analysis, the signal analyzer 134 analyzes all the vibration signals to filter the noise. For example, the vibration signals sent out from the vibration sensors 132b-1/132b-2 and 132c can be analyzed to filter the noise from the polishing pad 104 and the dresser 108. Accordingly, the vibration signals of the wafer carrier 106 may faithfully represent the vibration of the wafer carrier 106 and the semiconductor wafer 140 retained therein during the performing of the polishing operation. Following the same concept, the vibration signals sent out from the vibration sensors 132a-1/132a-2 and 132b-1/132b-2 can be analyzed to filter the noise from the polishing pad 104 and the wafer carrier 106, the vibration signals of the dresser 108 may faithfully represent the vibration of the dresser 108 during the performing of the polishing operation. The vibration signals sent out from the vibration sensors 132a-1/132a-2 and 132c can be analyzed to filter the noise from the wafer carrier 106 and the dresser 108, and the vibration signals of the platen 102 may faithfully represent the vibration of the platen 102 and the polishing pad 104 disposed thereon.

Further, the signal analyzer 134 develops or constructs process patterns according to the vibration signals of the platen 102, the wafer carrier 106 and the dresser 108. In some embodiments, the signal analyzer 134 further builds a process pattern database according to the vibration signals of the platen 102, the wafer carrier 106 and the dresser 108. As mentioned above, a standard process pattern may be generated by the signal analyzer 134. The process pattern, the standard process pattern and the process pattern database are discussed in the following description. In some embodiments, the signal analyzer 134 can further build a vibration pattern for the polishing pad 104 vibration signals of the platen 102, therefore polishing efficiency of the polishing surface 104s can be detected and controlled. In some embodiments, the polishing pad 104 may be replaced when the polishing efficiency is reduced according to the vibration pattern for the polishing pad 104. Following the same concept, the signal analyzer 134 can further build a vibration pattern for the dresser 108, therefore dressing efficiency of the dresser 108 can be detected and controlled. In some embodiments, the conditioning disc 108-3 may be replaced when the dressing efficiency is reduced according to the vibration pattern for the dresser 108.

In some embodiments, the vibration sensors 132a-1 or 132a-2, 132b-1 or 132b-2 and 132c may be commercially available piezoelectric sensors for displacement, velocity, or acceleration, but the disclosure is not limited thereto. In some embodiments, the signal analyzer 134 may be a commercially available device such as a programmable microprocessor, processor or computer.

Figure 6:
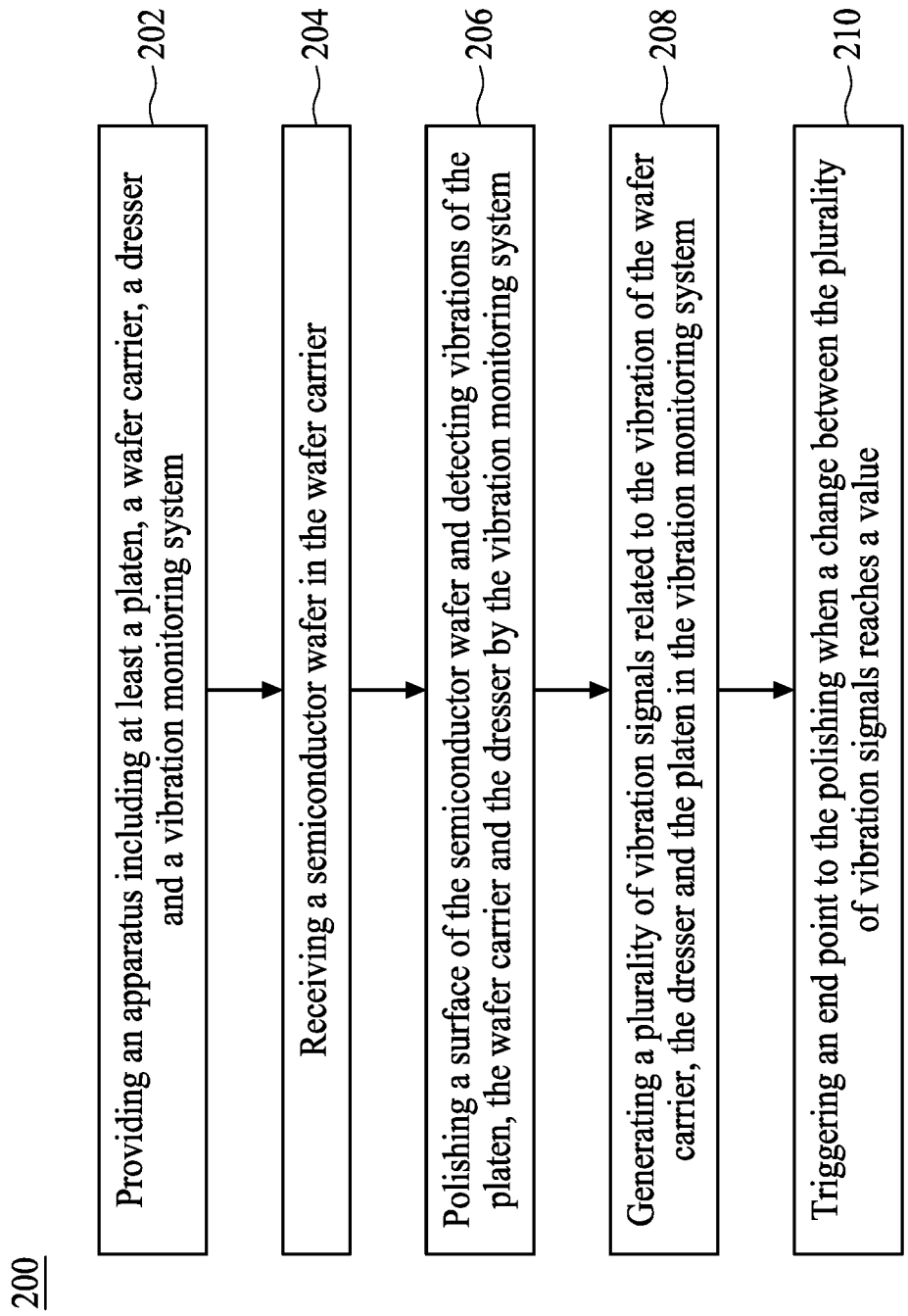
FIG. 6 is a flowchart representing a method for CMP according to aspects of the present disclosure.

FIG. 6 is a flowchart representing a method for CMP 200. The method for CMP 200 includes an operation 202, providing an apparatus for polishing. The apparatus for polishing can include the apparatus for CMP 100a, 100b or 100c as mentioned above. For example, the apparatus for polishing 100c can include at least the platen 102, the polishing pad 104 disposed on the platen 102, the wafer carrier 106, the dresser 108, the slurry dispenser 110, the CMP control system 120, and the vibration-monitoring system 130. The method for CMP 200 further includes an operation 204, receiving a semiconductor wafer 140 in the wafer carrier 106. The method for CMP 200 further includes an operation 206, polishing a surface of the semiconductor wafer 140 and detecting vibrations of the platen 102, the wafer carrier 106 and the dresser 108 by the vibration-monitoring system 130. The method for CMP 200 further includes an operation 208, generating a plurality of vibration signals related to the vibration of the wafer carrier 106, the dresser 108 and the platen 102 in the vibration-monitoring system 130. In some embodiments, the vibration sensors 132a-1/132a-2, 132b-1/132b-2 and 132c of the vibration-monitoring system 130 detect the vibration and generate the vibration signals, and the vibration signals are sent to and analyzed by the signal analyzer 134 of the vibration-monitoring system 130. The method for CMP 200 further includes an operation 210, triggering an end point to the polishing when a change between the plurality of vibration signals reaches a value. It should further be noted that additional operations may be provided before, during, and after the method for CMP 200, and that some other operations may be only briefly described herein. Thus, other implementations are possible within the scope of the various aspects described herein.

Referring back to FIG. 3, FIG. 4 or FIG. 5, a semiconductor wafer 140 is received and retained within the wafer carrier 106 according to operation 204. The CMP control system 120 may instruct the apparatus for CMP 100a, 100b or 100c to polish the surface of the semiconductor wafer 140 according to operation 206. Significantly, during the polishing of the surface of the semiconductor wafer 140 according to operation 206, the vibration sensor 132a-1 or 132a-2 detects the vibrations of the wafer carrier 106 and the semiconductor wafer 140, the vibrations sensor 132b-1 or 132b-2 detects the vibrations of the platen 102, and the vibration sensor 132c detects the vibrations of the dresser 108. Accordingly, the vibration signals are generated according to operation 208. As mentioned above, the vibration signals are related to the vibrations of the wafer carrier 106 and the semiconductor wafer 140, the vibration of the dresser 108, and the vibrations of the platen 102 and the polishing pad 104. Further, a process pattern is developed or constructed by the signal analyzer 134 according to the vibration signals. In some embodiments, the process pattern may be a wafer carrier vibration pattern, a dress vibration pattern, or a platen vibration pattern.

Figure 7A:
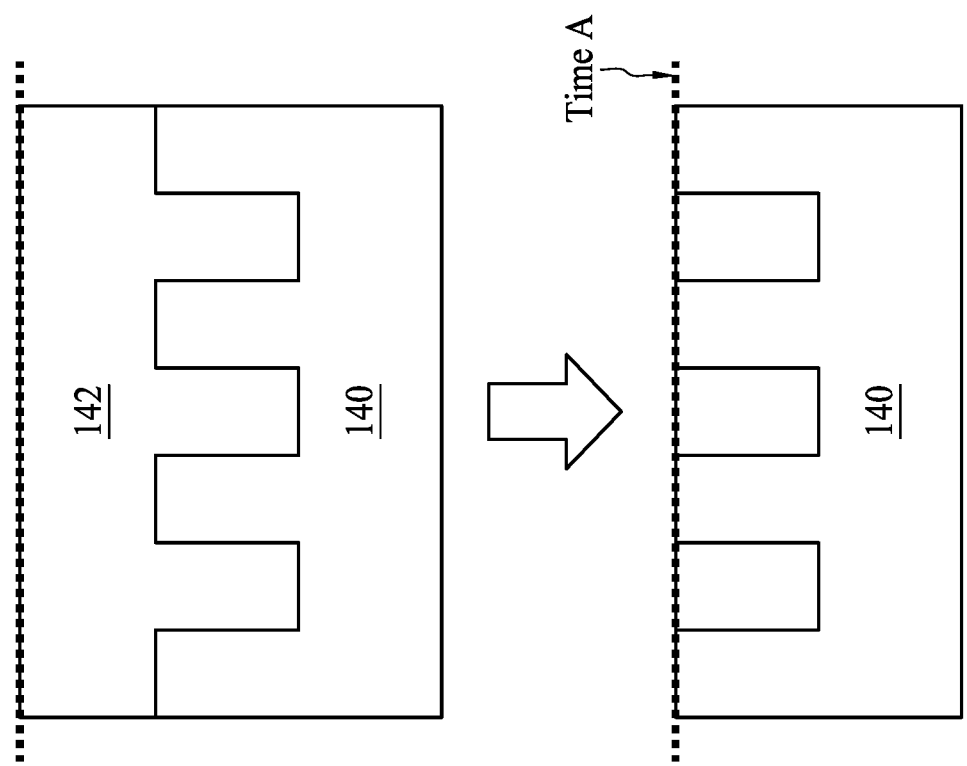
FIG. 7A is a schematic drawing illustrating various stages in CMP operation.
Figure 7B:
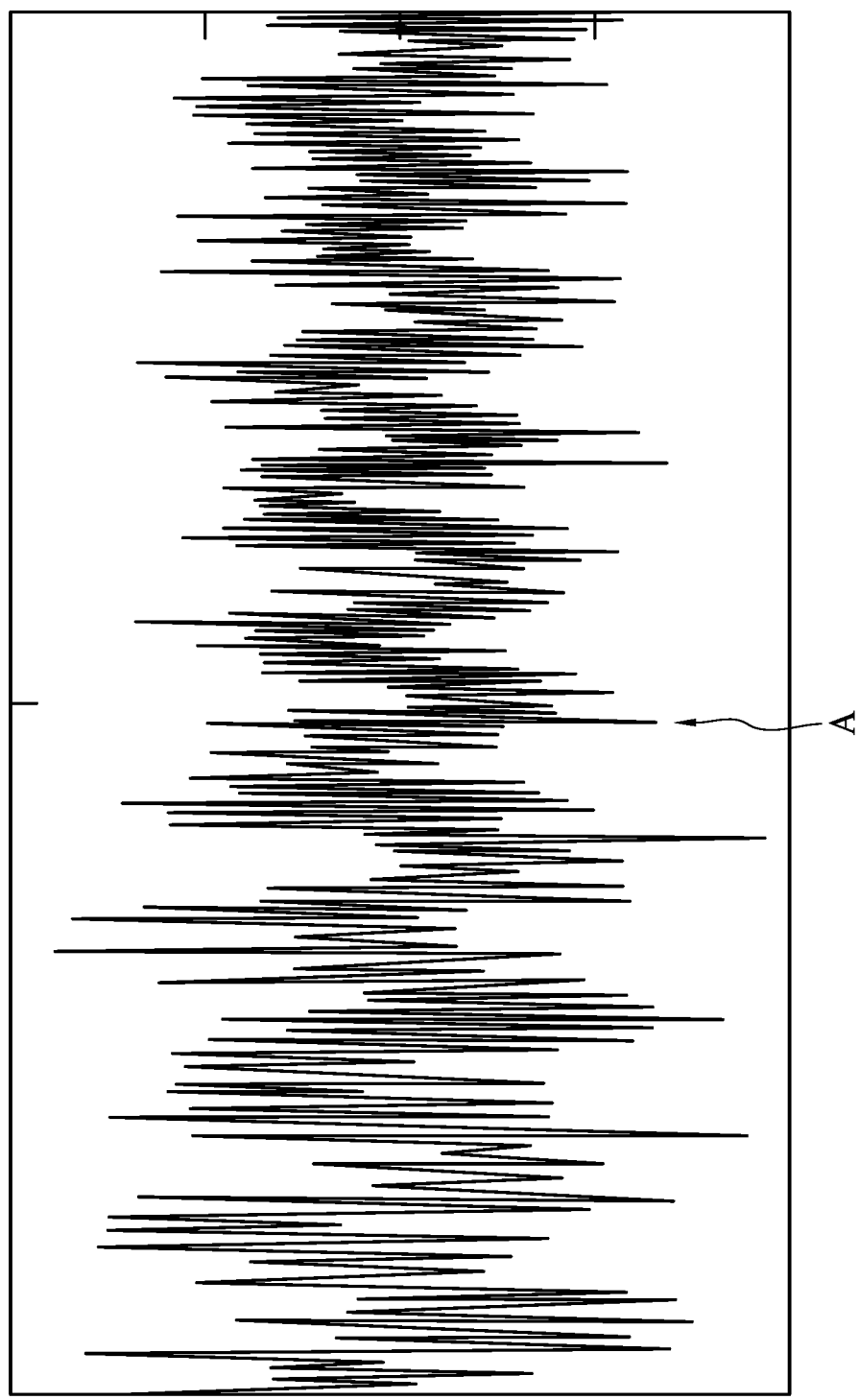
FIG. 7B is a graph showing a standard vibration pattern of a polishing operation of a CMP apparatus according to aspects of the present disclosure.

Please refer to FIG. 7A, which is a schematic drawing illustrating various stages in CMP operation, and FIG. 7B, which is a process pattern, such as a wafer carrier vibration pattern. The wafer carrier vibration pattern can be an amplitude-time pattern as shown in FIG. 7B. The abscissa of the vibration pattern can be operation time and the ordinate of the vibration pattern can be vibration amplitude. Referring to FIG. 7A, in some embodiments, the method for CMP 200 is performed to remove an excess material 142, such as a metal layer or a dielectric layer, from the semiconductor wafer 140, and vibration may be detected by the vibration sensor 132a-1 or 132a-2 installed on the wafer carrier 106. During the polishing of the excess material 142, the amplitudes are the same until the excess material 142 is removed to expose the semiconductor wafer 140. It should be understood that friction between the polishing pad 104 and the semiconductor wafer 140 may be different from friction between the polishing pad 104 and the excess material 142, and therefore vibration of the wafer carrier 106 and the semiconductor wafer 140 may change when the semiconductor wafer 140 is exposed. Accordingly, the amplitude may be changed.

As shown in FIGS. 7A and 7B, at time A, a noticeable change is observed because the semiconductor wafer 140 is exposed and the friction is changed. The plurality of vibration signals are compared during the polishing. In some embodiments, in operation 210, when the change between the vibration signals reaches a value, at time A , a report is sent to the CMP control system 120 by the signal analyzer 134, and the CMP control system 120 can take time A as a time to trigger an end point of the polishing to terminate the polishing operation. In some embodiments, the value is between approximately 20% and approximately 50%, depending on different process requirements. In some comparative embodiments, when the value is less than 20%, the vibration-monitoring system 130 may be too sensitive and the end point may be early triggered. In some comparative embodiments, when the value is greater than 20%, the vibration-monitoring system 130 may be too dull and the triggering of the end point may be delayed.

Referring to FIGS. 7A and 7B again, for example, when the polishing process is performed on the excess material 142, the change between the vibration signals is less than 20% (before time A) because the polishing process is performed on the same material. When the excess material 142 is removed to expose the semiconductor wafer, a surface friction may be changed, and thus vibration may be changed accordingly. As shown in FIG. 7B, when the difference between the vibrations is greater than 20%, it can be determined that the semiconductor substrate 140 is exposed and the end point is triggered to terminate the polishing operation. As mentioned above, in some embodiments, by having the vibration sensors 132a-1/132a-2, 132b-1/132b-2 and 132c working together, noise from the polishing pad 104 and the dresser 108 can be filtered, and the polishing result can be faithfully represented, and thus over-polishing and under-polishing issue can be mitigated.

Figure 8A:
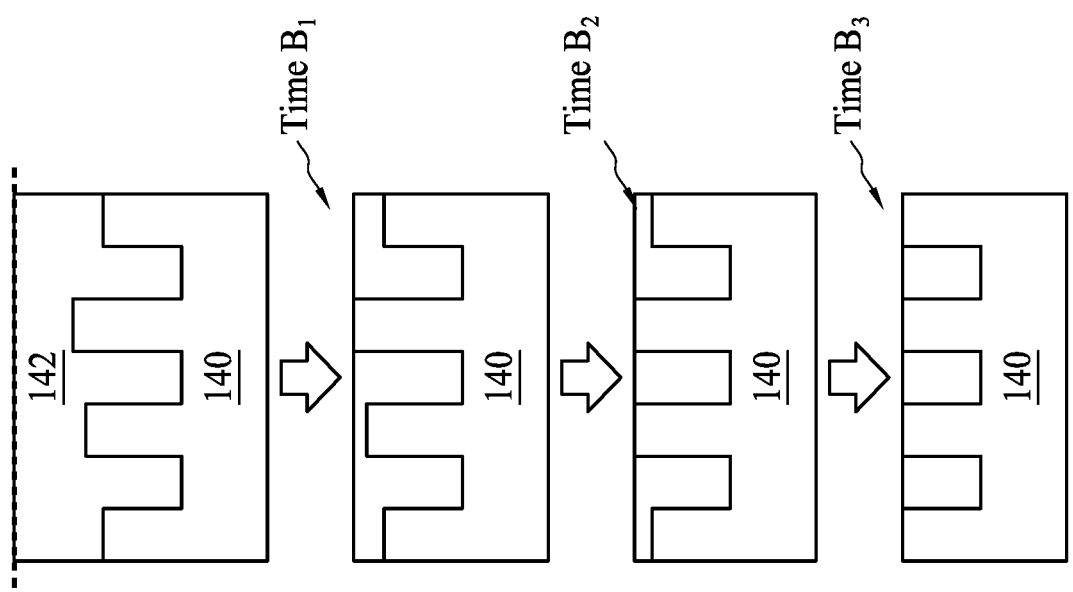
FIG. 8A is a schematic drawing illustrating various stages in CMP operation.

Please refer to Please refer to FIG. 8A, which is a schematic drawing illustrating various stages in CMP operation, and FIG. 8B, which is a process pattern, such as a wafer carrier vibration pattern. The wafer carrier vibration pattern can be an amplitude-time pattern as shown in FIG. 8B. The abscissa of the vibration pattern can be operation time and the ordinate of the vibration pattern can be vibration amplitude. As shown in FIG. 8A, in some embodiments, the method for CMP 200 is performed to remove an excess material 142, such as a metal layer or a dielectric layer from the semiconductor wafer 140, and vibration may be detected by the vibration sensor 132a installed on the wafer carrier 106. During the polishing of the excess material 142, the amplitudes are the same until the excess material 142 is removed to expose the semiconductor wafer 140. As mentioned above, friction between the polishing pad 104 and the semiconductor wafer 140 may be different from friction between the polishing pad 104 and the excess material 142, and therefore vibration of the wafer carrier 106 and the semiconductor wafer 140 may change once the semiconductor wafer 140 is exposed. Accordingly, the amplitude is changed. As shown in FIGS. 8A and 8B, at time $B_1$, a change is observed because a portion of the semiconductor wafer 140 is exposed. However, in some embodiments, when the semiconductor wafer 140 has poor uniformity, other portions of the semiconductor wafer 140 may still be covered by the excess material 142, and therefore the amplitude change at time $B_1$ may be less than a value. In some embodiments, the value is between approximately 20% and approximately 50%, depending on different process requirements, but the disclosure is not limited thereto. In some embodiments, the signal analyzer 134 may ignore the amplitude change at time $B_1$ and time $B_2$ when the amplitude change is less than the value. In some embodiments, when the excess material 142 is completely removed, the friction is changed again. Consequently, the vibration may be changed, and thus the amplitude may change. In some embodiments, a noticeable change, which means the amplitude change is greater than the value, is observed at time $B_3$. In some embodiments, the signal analyzer 134 may recognize the amplitude change and report to the CMP control system 120. The CMP control system 120 may take time $B_3$ as a time to trigger an end point of the polishing to terminate the polishing operation. In some embodiments, a process pattern such as the wafer carrier vibration pattern can be constructed, and thus an end point of the polishing can be triggered by observing the change in vibration and the change in the process pattern. Because the vibrations are directly related to the surface condition of the semiconductor wafer 140, the changes in vibration and process pattern faithfully represent a surface change on the semiconductor wafer 140a. Consequently, the end point of the polishing operation can be accurately triggered and thus the over-polishing issue and under-polishing issue are both mitigated.

In some embodiments, the process pattern can be the dresser vibration pattern or the platen vibration pattern. As mentioned above, since the vibrations are directly related to the surface condition, the dresser vibration pattern and the platen vibration pattern can be constructed to represent the surface condition of the polishing pad 104.

In some embodiments, the process pattern, such as the wafer carrier vibration pattern, the dresser vibration pattern and the platen vibration pattern, can be stored in the signal analyzer 134 of the vibration-monitoring system 130. In some embodiments, process patterns of different lots of semiconductor wafers undergoing the polishing operation are stored to build a process pattern database in the signal analyzer 134. Further, such process patterns are analyzed by, e.g. big data analysis, and a standard dresser vibration pattern, a standard platen vibration pattern and a standard wafer carrier pattern relating to the polishing operation and the apparatus for CMP 100a, 100b and 100c can be obtained and stored in the signal analyzer 134.

Figure 9:
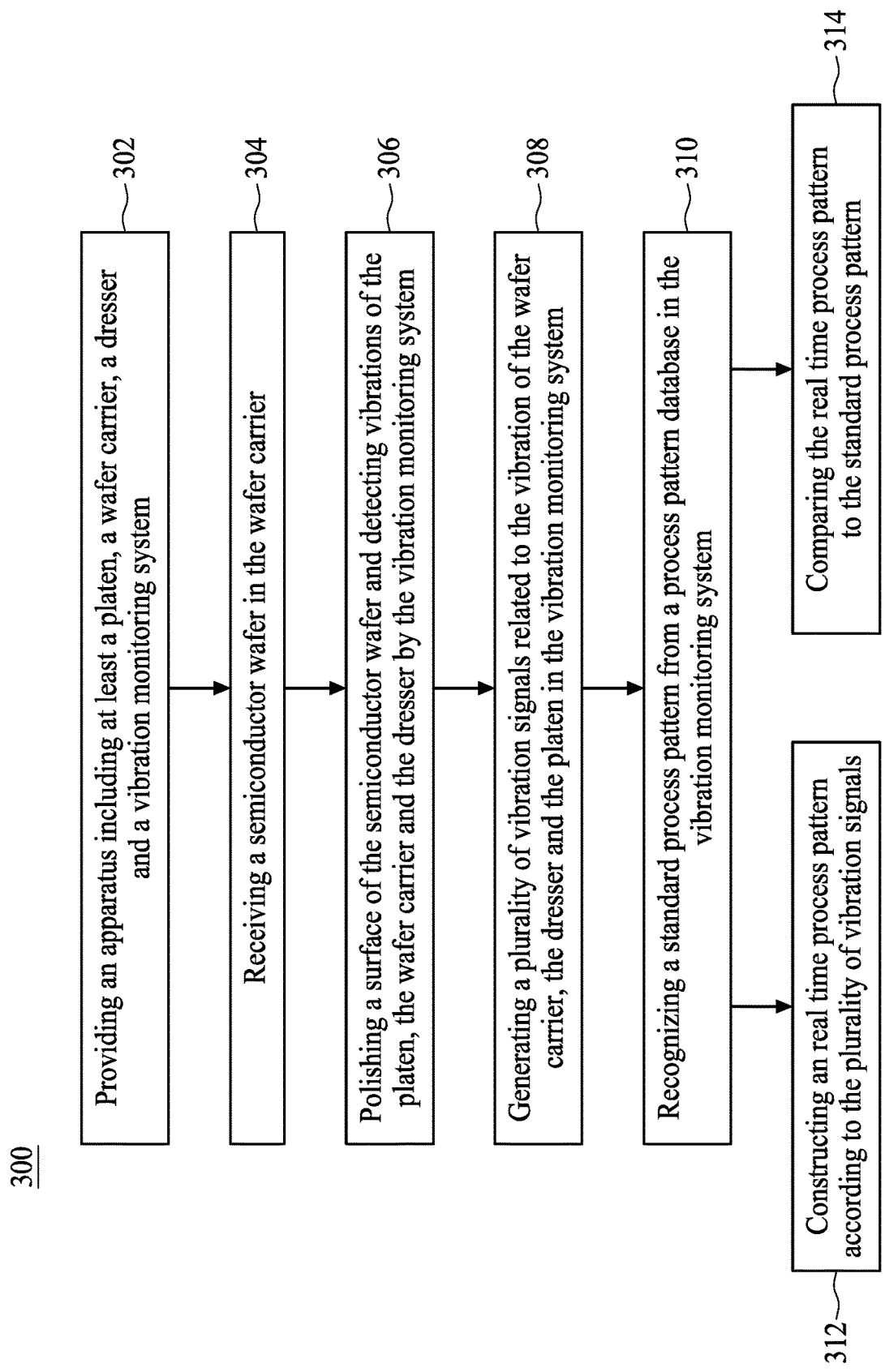
FIG. 9 is a flowchart representing a method for CMP according to aspects of the present disclosure.

FIG. 9 is a flowchart representing a method for CMP 300. The method for CMP 300 includes an operation 302, providing an apparatus for polishing. The apparatus for polishing can include the apparatus for CMP 100a, 100b or 100c as mentioned above. For example, the apparatus for polishing 100c can include at least the platen 102, the polishing pad 104 disposed on the platen 102, the wafer carrier 106, the dresser 108, the slurry dispenser 110, the CMP controller 120, and the vibration-monitoring system 130. The method for CMP 300 further includes an operation 304, receiving a semiconductor wafer 140 in the wafer carrier 106. The method for CMP 300 further includes an operation 306, polishing a surface of the semiconductor wafer 140 and detecting vibrations of the platen 102, the wafer carrier 106 and the dresser 108 by the vibration-monitoring system 130. The method for CMP 300 further includes an operation 308, generating a plurality of vibration signals related to the vibration of the wafer carrier 106, the dresser 108 and the platen 102 in the vibration-monitoring system 130. In some embodiments, the vibration sensors 132a, 132b and 132c of the vibration-monitoring system 130 detect the vibration and generate the vibration signals, and the vibration signals are sent to and analyzed by the signal analyzer 134 of the vibration-monitoring system 130. The method for CMP 300 further includes an operation 310, recognizing a standard process pattern from a process pattern database in the vibration-monitoring system 130. The method for CMP 300 further includes an operation 312, constructing a real-time process pattern according to the plurality of vibration signals. The method for CMP 300 further includes an operation 314, comparing the real-time process pattern to the standard process pattern. The method for CMP 300 is further described according to one or more embodiments. It should be noted that the operations of the method for CMP 300 may be rearranged or otherwise modified within the scope of the various aspects. It should further be noted that additional operations may be provided before, during, and after the method for CMP 300, and that some other operations may be only briefly described herein. Thus, other implementations are possible within the scope of the various aspects described herein.

In some embodiments, a standard process pattern can be recognized and selected from a process pattern database according to operation 310. In some embodiments, the process database may be built as mentioned above, but the disclosure is not limited thereto. The standard process pattern can be a standard dresser vibration pattern, a standard platen vibration pattern or a standard wafer carrier vibration pattern.

In some embodiments, vibrations are detected in operation 306, and vibration signals are generated in operation 308. As mentioned above, the vibration signals are related to the vibrations of the wafer carrier 106 and the semiconductor wafer 140, the vibration of the dresser 108, and the vibrations of the platen 102 and the polishing pad 104. Further, a process pattern is developed or constructed according to the vibration signals by the signal analyzer 134 according to operation 312. In some embodiments, the process pattern may be a wafer carrier vibration pattern, a dress vibration pattern, or a platen vibration pattern. It should be noted that in some embodiments, the process pattern is a real-time process pattern.

In some embodiments, the real-time process pattern is compared with the standard process pattern according to operation 314. In some embodiments, operation 312 and operation 314 can be performed simultaneously. In other words, the constructing of the real-time process pattern and the comparing of the real-time process pattern to the standard process pattern are simultaneously performed. It should be noted that in some embodiments, the vibration is detected continuously during the performing of the polishing operation, and the real-time process pattern is generated during the performing of the polishing operation.

In some embodiments, when the comparison indicates that the real-time process pattern and the standard process pattern are mismatched, or an amplitude exceeds a value, the signal analyzer 134 of the vibration-monitoring system 130 can generate different corresponding instructions.

Figure 10A:
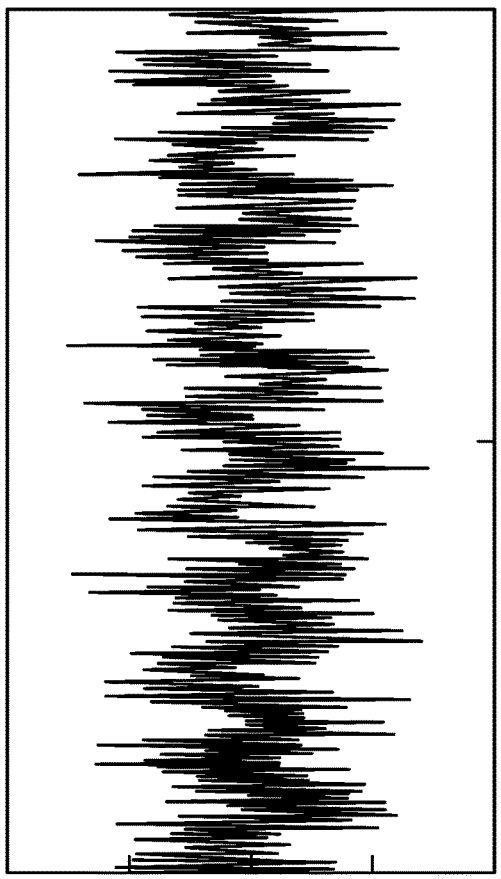
FIG. 10A is a graph indicating a standard dresser vibration pattern.
Figure 10B:
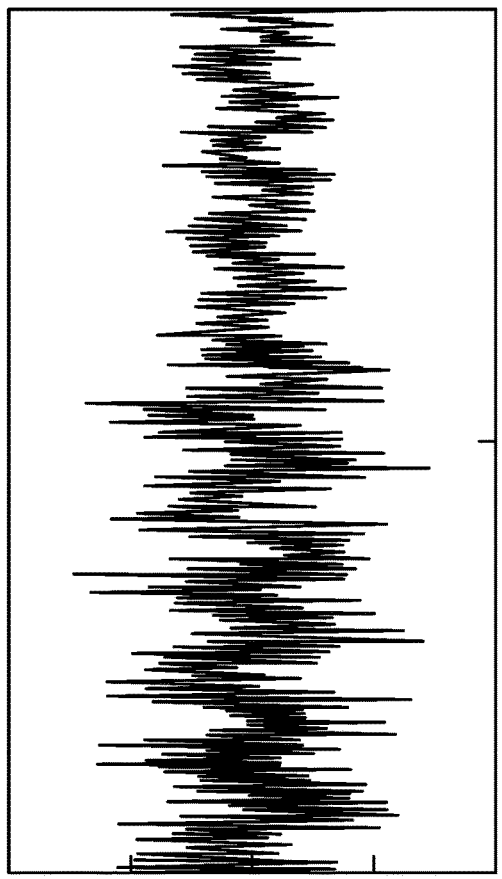
FIG. 10B is a graph indicating a real-time dresser vibration pattern.

FIG. 10A is a graph indicating a standard process pattern, and FIG. 10B is a graph indicating a real-time process pattern. In some embodiments, the standard process pattern can be a standard dresser vibration pattern and the real-time process pattern can be a real-time dresser vibration pattern. According to operation 312 and operation 314, the real-time dresser vibration pattern is generated and compared with the standard dresser vibration pattern. As mentioned above, friction between the polishing pad 104 and the conditioning disc may be reduced when the polishing pad 104 is consumed. Therefore vibration of the dresser head 108-2 may change and thus the amplitude of the real-time dresser vibration pattern may be reduced. Therefore, when the comparison indicates that the real-time process pattern and the standard process pattern are mismatched, the signal analyzer 134 of the vibration-monitoring system 130 may report to the CMP control system 120. In some embodiments, the CMP control system 120 may trigger an end point of the polishing operation when the real-time process pattern and the standard process pattern are mismatched. In some embodiments, the CMP control system 120 may raise an alarm, such as a pad surface roughness condition alarm, when the real-time process pattern and the standard process pattern are mismatched. In some embodiments, when a difference between the standard process pattern and the real-time process pattern reaches a value, the end point can be triggered. In some embodiments, the difference is between approximately 20% and approximately 50%. In some comparative embodiments, when the value is less than 20%, the vibration-monitoring system 130 may be too sensitive and the end point may be early triggered. In some comparative embodiments, when the value is less than 20%, the vibration-monitoring system 130 may be too sensitive and the end point may be early triggered. In some comparative embodiments, when the value is greater than 20%, the vibration-monitoring system 130 may be too dull and the triggering of the end point may be delayed.

In some embodiments, the standard process pattern can include a standard wafer carrier vibration pattern and a standard platen vibration pattern, while the real-time process pattern can be a real-time wafer carrier vibration pattern, a real-time dresser vibration pattern and a real-time platen vibration pattern. Comparison between such patterns may reveal a surface condition of the semiconductor wafer 140 undergoing the polishing operation.

Referring to FIGS. 7A and 10A again, for example, when the polishing process is performed on the excess material 142, a real-time process pattern can be generated, and the real-time wafer carrier vibration pattern is compared with a standard process pattern. When difference between the standard process pattern (shown in FIG. 10A) and the real-time process pattern (shown in FIG. 10B) is less than 20% before time A, it is referred that the polishing process is performed on the same material. When the excess material 142 is removed to expose the semiconductor wafer, a surface friction may be changed, and thus vibration may be changed accordingly. As shown in FIGS. 7A, 10A and 10B, when the difference between the standard process pattern and the real-time process pattern the vibrations is greater than the value (such as 20%), it can be determined that the semiconductor substrate 140 is exposed and the end point is triggered to terminate the polishing operation. As mentioned above, in some embodiments, by having the vibration sensors 132a-1/132a-2, 132b-1/132b-2 and 132c working together, noise from the polishing pad 104 and the dresser 108 can be filtered, and the polishing result can be faithfully represented, and thus over-polishing and under-polishing issue can be mitigated.

Referring to back FIG. 8A. in other embodiments, when the polishing process is performed on the excess material 142 as shown in FIG. 8A, a real-time process pattern can be generated, and the real-time wafer carrier vibration pattern is compared with a standard process pattern. When a difference between the real-time process pattern and the standard process pattern is less than 20% at time $B_1$, it can be determined the polishing process is performed on the same material. When the excess material 142 is removed to expose the semiconductor wafer 140, a surface friction may be changed, and thus vibration may be changed accordingly. In some embodiments, it is determined that the value is greater than 20%, such as 50%. Therefore when the difference between the real-time process pattern and the standard process pattern is less 50%, it can be determined that the polishing operation has not reached the end point at time $B_2$. In some embodiments, the polishing operation is performed until more semiconductor substrate 140 is exposed. When the change between the real-time process pattern and the standard process pattern is substantially 50%, an end point is triggered to terminate the polishing operation.

Additionally, in some embodiments, by having the vibration sensors 132a-1/132a-2, 132b-1/132b-2 and 132c working together, noise from the polishing pad 104 and the dresser 108 can be filtered, and the polishing result can be faithfully represented, and thus over-polishing and under-polishing issue can be mitigated.

Referring back to FIGS. 3, 4 and 5, in some embodiments, diamond particles and metallic particles may fall off the conditioning disc 108-3 and onto the polishing pad 104. The diamond and metallic particles may cause the semiconductor wafer 140 to be scratched, thus reducing the yield of the polishing operation. In some embodiments, operations 312 and 314 are performed, such that the real-time wafer carrier vibration pattern is compared with the standard wafer carrier vibration pattern, the real-time dresser vibration pattern is compared with the standard dresser vibration pattern, and the real-time platen vibration pattern is compared with the standard vibration pattern. When the comparison indicates that the real-time process patterns and the standard process patterns are mismatched, the signal analyzer 134 of the vibration-monitoring system 130 may raise an alarm, which reveals that the surface of the semiconductor wafer 140 is scratched, to an operator and/or the CMP control system 120. In some embodiments, the CMP control system 120 stops the polishing operation. Thus, the diamond and metallic particles can be removed from the polishing pad 104 once the mismatch is recognized and the alarm is sent out. Consequently, further damage to the semiconductor wafer 140 is prevented. Further, once the polishing pad 104 is cleaned and prepared, the semiconductor wafer 140 or another semiconductor wafer can be processed without the wafer being scratched.

In some embodiments, the standard process patterns including the standard wafer carrier vibration pattern, the standard dresser vibration pattern and the standard platen vibration pattern, and the real-time process patterns including the real-time wafer carrier vibration pattern, the real-time dresser vibration pattern and the real-time platen vibration pattern are compared to reveal the surface condition of the polishing pad 104.

The polishing pad 104 is an expensive consumable item used in a semiconductor wafer fabrication operation. It may be a hard, incompressible pad or a soft pad. The hard pad and the soft pad can even be combined in an arrangement of stacked pads for customized applications. The polishing pad 104 is typically provided with grooves in its polishing surface 104s for slurry distribution and improving pad-to-wafer contact, thus improving polishing efficiency. During a polishing operation, the polishing pad 104 is consumed and depths of the grooves are reduced. Consequently, slurry distribution and polishing efficiency are adversely impacted when the grooves get shallow. Further, the polishing pad 104 has to be replaced when the grooves are no longer observed.

In some embodiments, the friction of the polishing pad 104 may change when the grooves become shallow, and thus vibrations of the dresser 108, the polishing pad 104 and the platen 102 may be changed. By comparing the real-time dresser vibration pattern and the real-time platen vibration pattern with the standard dresser vibration pattern and the standard platen vibration pattern, the surface condition of the polishing pad 104 may be easily revealed. As mentioned above, once a noticeable change is found in the comparison, the signal analyzer 134 may send a pad surface roughness condition alarm to an operator and the CMP control system 120. In some embodiments, the CMP control system 120 stops the polishing operation, and the polishing pad 104 is replaced.

In some embodiments, the standard process patterns including the standard wafer carrier vibration pattern, the standard dresser vibration pattern and the standard platen vibration pattern, and the real-time process patterns including the real-time wafer carrier vibration pattern, the real-time dresser vibration pattern and the real-time platen vibration pattern are compared to reveal the work condition of the apparatus for CMP 100a, 100b and 100c.

For example, once a noticeable change is found in the comparison of all the real-time process patterns and all the standard process patterns, the signal analyzer 134 may send an equipment failure alarm to an operator and the CMP control system 120. In some embodiments, the CMP control system 120 stops the polishing operation, and the apparatus for CMP 100a or 100b is halted for further inspection.

The present disclosure provides an apparatus for CMP that is able to provide information about the apparatus, the polishing operation, and surface condition of the semiconductor wafer undergoing the polishing operation. By implementing a vibration-monitoring system, which includes the vibration sensors installed on the wafer carrier, the platen and the dresser, the vibration signals related to the wafer carrier and the semiconductor wafer retained therein, the platen and the polishing pad disposed thereon, and the dresser are collected, stored and the analyzed. Accordingly, the process patterns that reveal the surface condition of the semiconductor wafer and surface roughness of the polishing pad can be constructed, the process pattern database can be built, and the standard process pattern can be obtained. Further, by observing the noticeable change in the process pattern or by comparing the real-time process pattern to the standard process pattern, an end point of the polishing operation can be recognized by the vibration-monitoring system and triggered by the CMP control system. In addition, by comparing the real-time process pattern to the standard process pattern, alarms such as scratch alarm, pad surface roughness condition alarm, or equipment failure alarm can be raised in time.

In some embodiments, an apparatus for CMP is provided. The apparatus for CMP includes a platen, a wafer carrier retaining a semiconductor wafer during a polishing operation, a dress head retaining a disc configured to recondition a polishing pad disposed on the platen during the polishing operation, and a vibration-monitoring system configured to detect vibrations during the polishing operation. The vibration-monitoring system includes a first vibration sensor configured to generate a plurality of first vibration signals, and a signal analyzer configured to construct a process pattern according to the plurality of first vibration signals.

In some embodiments, a method for CMP is provided. The method for CMP includes the following operations. An apparatus for CMP including at least a platen, wafer carrier, a dresser and a vibration-monitoring system is provided. A semiconductor wafer is received in the wafer carrier. A surface of the semiconductor wafer is polished, and vibrations of the platen, the wafer carrier and the dresser are detected by the vibration-monitoring system. A plurality of vibration signals related to the vibrations of the wafer carrier, the dresser and the platen is generated in the vibration-monitoring system. An end point is triggered to the polishing when a change between the plurality of vibration signals reaches a value.

In some embodiments, a method for CMP is provided. The method includes the following operations. An apparatus including at least a platen, a wafer carrier, a dresser head and a vibration-monitoring system is provided. A semiconductor wafer is received in the wafer carrier. A surface of the semiconductor wafer is polished and vibrations of the platen, the wafer carrier and the dresser are detected by the vibration-monitoring system. A plurality of vibration signals related to the vibrations of the platen, the wafer carrier and the dresser is generated. A standard process pattern is recognized from a process pattern database in the vibration-monitoring system. A real-time process pattern is constructed according to the plurality of vibration signals. The real-time process pattern is compared to the standard process pattern.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An apparatus for chemical mechanical polishing (CMP) comprising:
    a platen;
    a wafer carrier retaining a semiconductor wafer during a polishing operation;
    a dresser head retaining a disc configured to recondition a polishing pad disposed on the platen during the polishing operation; and
    a vibration-monitoring system configured to detect vibrations during the polishing operation, wherein the vibration-monitoring system comprises:
        a first vibration sensor installed on the wafer carrier, and configured to detect vibrations of the wafer carrier to generate a plurality of first vibration signals related to the wafer carrier;
        a second vibration sensor installed on the dresser head, and configured to detect vibrations of the dresser head to generate a plurality of second vibration signals related to the dresser head; and
        a signal analyzer configured to filter noise from the dresser head according to the plurality of second vibration signals and construct a process pattern according to the plurality of first vibration signals.

2. The apparatus of claim 1, further comprising a slurry dispenser configured to dispense an abrasive slurry onto the polishing pad.

3. The apparatus of claim 2, further comprising a control system configured to control the platen, the wafer carrier, the dresser head and the slurry dispenser.

4. The apparatus of claim 1, wherein the vibration-monitoring system comprises a third vibration sensor installed on the platen and configured to detect vibration of the platen and to generate a plurality of third vibration signals.

5. The apparatus of claim 4, wherein the signal analyzer is configured to construct the process pattern according to the first vibration signals, the second vibration signals and the third vibration signals.

6. The apparatus of claim 5, wherein the signal analyzer filters noise from the platen according to the plurality of third vibration signals to construct the process pattern.

7. The apparatus of claim 4, wherein the signal analyzer builds a process pattern database according to the first vibration signals, the second vibration signals and the third vibration signals.

8. The apparatus of claim 7, wherein the signal analyzer filters noise from the platen according to the plurality of third vibration signals to construct the process pattern database.

9. A method for CMP, comprising:
    providing an apparatus comprising at least a platen, a wafer carrier, a dresser and a vibration-monitoring system;
    receiving a semiconductor wafer in the wafer carrier;
    polishing a surface of the semiconductor wafer and detecting vibrations of the platen, the wafer carrier and the dresser by the vibration-monitoring system;
    generating a plurality of vibration signals related to the vibrations of the wafer carrier, the dresser and the platen in the vibration-monitoring system, wherein the plurality of vibration signals includes a plurality of first vibration signals related to the wafer carrier, a plurality of second vibration signals related to the dresser and a plurality of third vibration signals related to the platen;
    filtering noise from the dresser and the platen according to the plurality of second vibration signals and the plurality of third vibration signals; and
    triggering an end point to the polishing when a change between the plurality of first vibration signals reaches a value.

10. The method of claim 9, wherein the value is between approximately 20% and approximately 50%.

11. The method of claim 9, wherein the dresser comprises a dresser arm, a dresser head and a conditioning disc, and the plurality of second vibration signals are related to vibration of the dresser head.

12. The method of claim 9, further comprising constructing a process pattern according to the plurality of vibration signals and storing the process pattern to build a process pattern database in the vibration-monitoring system.

13. The method of claim 12, further comprising generating a standard process pattern from the process pattern database.

14. The method of claim 12, wherein the process pattern is a wafer carrier vibration pattern.

15. A method for CMP, comprising:
    providing an apparatus comprising at least a platen, a wafer carrier, a dresser and a vibration-monitoring system;
    receiving a semiconductor wafer in the wafer carrier;
    polishing a surface of the semiconductor wafer and detecting vibrations of the platen, the wafer carrier and the dresser by the vibration-monitoring system;
    generating a plurality of vibration signals related to the vibrations of the platen, the wafer carrier and the dresser, wherein the plurality of vibration signals includes a plurality of first vibration signals related to the wafer carrier, a plurality of second vibration signals related to the dresser and a plurality of third vibration signals related to the platen;
    filtering noise from the platen according to the plurality of second vibration signals and the dresser according to the plurality of third vibration signals;
    recognizing a standard process pattern from a process pattern database in the vibration-monitoring system;
    constructing a real-time process pattern according to the plurality of first vibration signals; and
    comparing the real-time process pattern to the standard process pattern.

16. The method of claim 15, wherein the real-time process pattern comprises a wafer carrier vibration pattern.

17. The method of claim 15, further comprising raising an alarm when the real-time process pattern and the standard process pattern are mismatched.

18. The method of claim 15, wherein the dresser comprises a dresser arm, a dresser head and a conditioning disc, and the plurality of second vibration signals are related to vibration of the dresser head.

19. The method of claim 15, wherein the constructing of the real-time process pattern and the comparing of the real-time process pattern to the standard process pattern are simultaneously performed.

20. The method of claim 19, further comprising triggering an end point when the real-time process pattern and the standard process pattern are mismatched.

* * * * *